(12) United States Patent
Mikami

(10) Patent No.: US 7,944,030 B2
(45) Date of Patent: May 17, 2011

(54) LEAD FRAME AND METHOD OF MANUFACTURING THE SAME

(75) Inventor: Juntaro Mikami, Isa (JP)

(73) Assignee: Sumitomo Metal Mining Co., Ltd., Tokyo (JP)

( * ) Notice: Subject to any disclaimer, the term of this patent is extended or adjusted under 35 U.S.C. 154(b) by 0 days.

(21) Appl. No.: 12/585,681

(22) Filed: Sep. 22, 2009

(65) Prior Publication Data
US 2010/0078785 A1   Apr. 1, 2010

(30) Foreign Application Priority Data

Sep. 29, 2008   (JP) ................................ 2008-250738

(51) Int. Cl.
*H01L 23/495* (2006.01)
*H01L 21/00* (2006.01)

(52) U.S. Cl. ......... 257/666; 257/677; 438/121; 438/123

(58) Field of Classification Search ................... None
See application file for complete search history.

(56) References Cited

FOREIGN PATENT DOCUMENTS

| | | |
|---|---|---|
| JP | 64-12563 U | 1/1989 |
| JP | 2003-297995 A | 10/2003 |
| JP | 2005-079524 A | 3/2005 |
| JP | 2006-093559 A | 4/2006 |
| JP | 2006-310397 A | 11/2006 |

OTHER PUBLICATIONS

Notification of Reasons for Rejection mailed Jul. 6, 2010, issued in the corresponding Japanese Patent Application No. 2008-250738 and English translation thereof.

*Primary Examiner* — Scott B Geyer
(74) *Attorney, Agent, or Firm* — Edwards Angell Palmer & Dodge LLP

(57) ABSTRACT

A lead frame includes a base material having a front surface for mounting of a semiconductor chip and a back surface for connection with an external board, and an Ni layer having a thick section and thin section. The thick section is formed on the back surface of the base material, whereas the thin section is formed on all or a part of the front surface of the base material. It is preferable that the thick section has a thickness ranging from 2.5 to 5 μm, and the thin section is 0.5-2 μm thinner than the thick section. The lead frame can be manufactured with improved productivity by forming an Ni layer on both front and back surfaces of the base material, and then etching only the Ni layer formed on the front surface of the base material.

19 Claims, 3 Drawing Sheets

LEAD FRAME AND METHOD OF MANUFACTURING THE SAME

BACKGROUND OT THE INVENTION

1. Field of the Invention

The present invention relates to a lead frame and its method of manufacture, and is particularly concerned with a lead frame used for manufacturing a semiconductor package with single-sided encapsulation, such as an SON (Small Outline Non-Leaded) or a QFN (Quad Flat Non-Leaded).

2. Description of the Related Art

There is increasing use of chip-size packages for semiconductor devices mounted on a printed circuit board or the like due to market demand along with downsizing and miniaturization of electronic devices. In particular, a semiconductor package with single-sided encapsulation such as an SON package or a QFN package is commercially produced for semiconductor device that uses a lead frame for its manufacture. The semiconductor package with single-sided encapsulation uses resin that encapsulates or encloses a semiconductor chip or die placed on an upper surface of the lead frame, while exposing a portion of the lead frame along a lower surface of the lead frame, i.e., a back surface of the package.

FIG. 8 is an example of such semiconductor device 9 with single-sided encapsulation, which is manufactured by using a lead frame 5. The lead frame 5 is formed to have its pattern by etching or stamping (pressing) a base material 1 of a metal sheet. The patterned base material 1 is then plated to have a three-layered plating film consisting of an Ni layer 2, a Pd layer 3 and an Au layer 4 over the entire surface of the base material 1, i.e., a front surface 1a, a back surface 1b, and a lateral surface 1c.

Semiconductor chips 6 are then placed on respective die pad sections 5a of the lead frame 5. Each semiconductor chip 6 is connected to the lead sections 5b of the lead frame 5 by bonding wires 7. An upper surface (front surface 1a) and a lateral surface 1c of the lead frame 5 are covered with resin 8 to encapsulate the semiconductor chips 6 mounted on the front surface 1a. This encapsulated unit is then cut apart or singulated to produce multiple individual semiconductor devices 9.

The semiconductor device 9 with single-sided encapsulation has a structural feature whereby lower surfaces (back surface 1b) of the lead sections 5b are exposed from the resin 8 so that they come into contact with an external board such as a printed circuit board (not shown). This feature however suffers from insufficient adhesion between the lead sections 5b and the resin 8, which leads to a problem in that some lead sections 5b become detached from the resin 8 and fall off during the cutting step described above.

To solve this problem, Japanese Patent Application Laid-Open No. 2006-93559 proposes a method of using two kinds of Ni-plating solutions to form two kinds of Ni layers, each having different compositions on the upper and lower surfaces of the lead frame. By forming these two kinds of Ni layers, a three-layered plating film having a rough surface and consisting of an Ni layer, a Pd layer and an Au layer is formed on the upper surface of the lead frame. On the other hand, another three-layered plating film having a smooth surface and consisting of an Ni layer, a Pd layer and an Au layer is formed on the lower surface of the lead frame. This configuration improves adhesion between the resin and the lead frame.

To evaluate the adhesion between the resin and the lead frame having the three-layered plating film with a rough surface, the adhesive strength was measured in the following manner. First, a three-layered plating film having the rough surface described above was formed on a metallic base material. On this three-layered plating film, four resin moldings each 2 mm in diameter were formed under a mold-filling pressure of 100 kg/cm$^2$ and the molding conditions of 175° C.×90 seconds. These four resin moldings were then hardened for eight hours at approximately 175° C. in an oven. The four resin samples evaluated were thus formed. Each resin sample was then pushed sideways by applying an increasing load. The load value applied at the instant that the resin sample became detached was measured. Each load value thus obtained was divided by the area of adhesion of the corresponding resin sample to determine the load value per unit area. The average of these four converted values represents the adhesive strength between the resin and the lead frame.

This evaluation revealed that the adhesive strength between the resin and the metallic base material having the three-layered plating film with the rough surface was 19.9 MPa. For comparison, another metallic base material was prepared on which a three-layered plating film having a smooth surface and consisting of an Ni layer, a Pd layer and an Au layer was formed. The adhesive strength of this conventional three-layered plating film was evaluated in a similar manner, and was found to be 9.5 MPa. These results show that the three-layered plating film having a rough surface improves adhesion and has greater adhesion than the conventional three-layered plating film.

Japanese Patent Application Laid-Open No. 2006-310397 shows a technique for roughening the surface of a base material for the lead frame of a copper system. Specifically, this technique uses a micro-etching solution to slightly dissolve the metallic surface of the base material. In this manner, minute concavities and convexities are formed on the metallic surface of the base material.

On this roughened base material, a conventional three-layered plating film consisting of an Ni layer, a Pd layer and an Au layer was formed. Thereafter, the adhesive strength was evaluated in a manner similar to that described above. The adhesive strength of this roughened base material with the conventional three-layered plating film was 11.8 MPa. It was thus confirmed that forming the three-layered plating film on the roughened base material also improves the adhesion and has greater adhesion than the conventional three-layered plating film formed on the conventional metallic base material, although its adhesive strength was slightly inferior to that achieved by the technique shown in Japanese Patent Application Laid-Open No. 2006-93559 mentioned above.

The method of forming the Ni layers disclosed in Japanese Patent Application Laid-Open No. 2006-93559 may however cause a problem of warping due to the stress difference between the Ni layers, which are sequentially formed on each of the front and back surfaces of the lead frame using two kinds of plating solutions. Moreover, use of the two kinds of plating solution needs longer plating apparatus and more plating steps. Accordingly, the plating process requires complicated management and more processing time, which leads to low productivity. The micro-etching process shown in Japanese Patent Application Laid-Open No. 2006-310397 also has a problem that the etching process requires additional etching apparatus and more processing time, which also leads to low productivity.

SUMMARY OF THE INVENTION

In view of these and other considerations, it is an object of the present invention to provide a lead frame having a plated layer to improve adhesion between the lead frame and the encapsulation resin without reducing productivity.

To achieve the aforementioned objectives, a lead frame in accordance with the present invention includes a base material having a front surface for mounting of a semiconductor chip and a back surface for connection with an external board, and an Ni layer having thick and thin sections formed on the front and back surfaces of the base material. The thick section is formed on the back surface of the base material, whereas the thin section is formed on all or a part of the front surface of the base material. It is preferable that the thick section has a thickness ranging from 2.5 to 5 μm, and that the thin section is thinner than the thick section by 0.5-2 μm.

The lead frame according to the present invention may have the thick section in a specified area of the front surface including a die-pad site and a wire-bonding site, and the thin section may be formed in other area than the die-pad site and the wire-bonding site.

The lead frame according to the present invention may have a Pd layer and an Au-plated layer over the thick section and the thin section. The lead frame may include a die pad section and a lead section, and an overhanging section having a reversed staircase shape may be formed on an edge of said die pad section and/or lead section. Either no Ni layer may be formed or an extremely thin Ni layer not more than 0.2 μm thick may be formed on a lateral surface of the base material of the lead frame. On the lateral surface of the base material of the lead frame, the Pd layer and the Au layer may be formed directly or via the extremely thin Ni layer.

A method for manufacturing a lead frame according to the present invention includes a step of forming an Ni layer having a predetermined thickness on a front surface of a metallic base material for mounting of a semiconductor device and on a back surface of the metallic base material for connection with an external board, and a step of etching only the Ni layer formed on the front surface of the metallic base material such that the Ni layer formed on the front surface is thinner than that on the back surface. Specifically, the lead frame may be formed by forming an Ni layer having a thickness ranging from 2.5 to 5 μm on front and back surfaces on a metallic base material, and by etching only the Ni layer on the front surface which corresponds to a side for mounting of the semiconductor device. In this manner, the thickness of the Ni layer on the front surface may be reduced to be thinner than the Ni layer on the back surface by 0.5-2 μm.

This manufacturing method has such feature that only one side of the metallic base material is processed by the etching solution before the metallic base material is formed to have a lead frame pattern. Therefore it has minimal effect on the Ni layer on the opposite side of the metallic base material.

The method may further include a step of forming a predetermined mask over the Ni layer, a step of etching a part of the Ni layer exposed from the mask and a part of the metallic base material positioned below the part of the Ni layer, a step of removing the mask, and a step of forming a Pd layer and an Au layer. The method may also include a step of forming an extremely thin Ni layer not more than 0.2 μm thick before the step of forming the Pd layer and the Au layer. In addition, the method may include a step of forming a mask to create a thin section in specified areas on the side for mounting of the semiconductor device after forming the Ni layer with the predetermined thickness on both the front and back surfaces of the metallic base material, and a step of forming the thin section by etching the Ni layer and removing the mask.

According to the present invention, a lead frame having improved adhesion to the resin used for encapsulation can be formed without reducing productivity.

DESCRIPTION OF THE PREFERRED EMBODIMENTS

Figure 1:
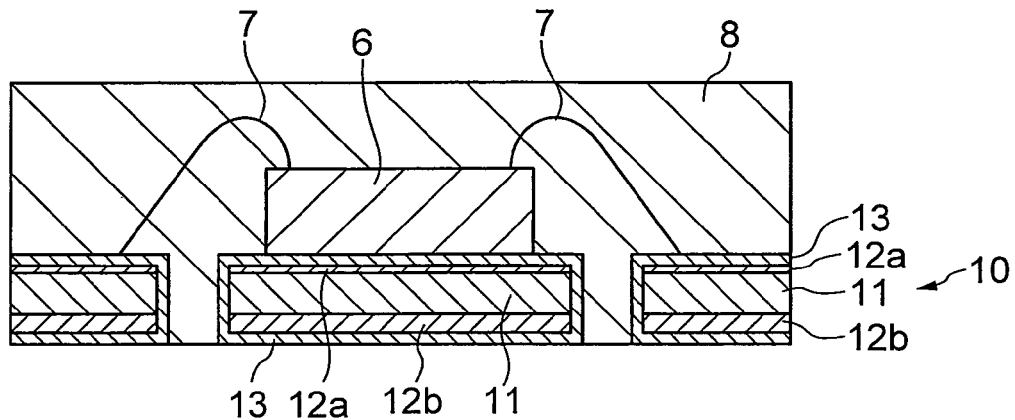
FIG. 1 shows a cross-sectional view of a semiconductor device which is manufactured by the use of a lead frame according to the first embodiment of the present invention.

A lead frame according to the first embodiment of the present invention is first described in reference to FIG. 1. A lead frame 10 of the first embodiment includes a metallic base material 11 and an Ni layer formed on a front and a back surface of the metallic base material 11. The Ni layer is characterized by having a thin section 12a and a thick section 12b. The thin section 12a of the Ni layer is formed on all the front surface of the metallic base material 11. The front surface of the metallic base material 11 corresponds to a side for mounting of the semiconductor device 6. The thick section 12b of the Ni layer which is thicker than the thin section 12a is formed on the back surface of the metallic base material 11. The back surface of the metallic base material 11 corresponds to a side for connection with an external board (not shown). It is preferable that the thick section 12b has a thickness ranging from approximately 2.5 to 5 μm, and that the thin section 12a is thinner than the thick section 12b by approximately 0.5-2 μm.

Figure 2:
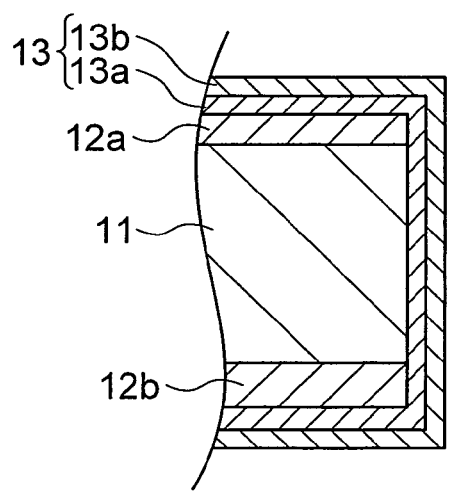
FIG. 2 shows a partially enlarged sectional view of one example of a lead section of a lead frame according to the first embodiment of the present invention.

A layered structure 13 including a Pd layer 13a and an Au layer 13b is formed over the thin section 12a and the thick section 12b of the Ni layer, as shown in FIG. 2, which is a partially enlarged sectional view of the lead frame 10. This layered structure 13 is also formed on the lateral surface of the metallic base material 11, which is substantially vertical to the front and back surfaces the of metallic base material 11 of the lead frame 10. As indicated below, stamping or etching of the metallic base material 11 to form the lead frame pattern is performed after forming the thin section 12a and the thick section 12b on the metallic base material 11. Accordingly, neither the thin section 12a nor thick section 12b is formed on the lateral surface of the metallic base material 11 of the lead frame 10. The layered structure 13 is therefore directly formed on the lateral surface of the metallic base material 11 of the lead frame 10.

Figure 3:
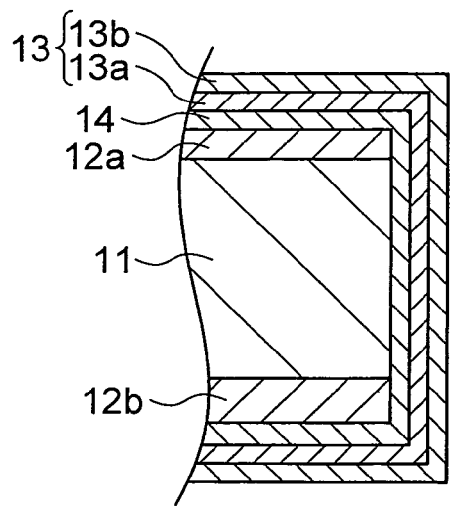
FIG. 3 shows a partially enlarged sectional view of another example of a lead section of a lead frame according to the first embodiment of the present invention.

As shown in FIG. 3, which is a partially enlarged sectional view of the lead frame 10, an extremely thin Ni layer 14 not more than approximately 0.2 μm thick may be formed after etching or stamping of the metallic base material 11. In this case, the extremely thin Ni layer 14 is formed over the entire surface of the lead frame 10, including the lateral surface thereof. Therefore, the layered structure 13 is formed on the lateral surface of the metallic base material 11 of the lead frame 10 via the extremely thin Ni layer 14.

As described below, the thin section 12a is formed by consecutive steps of forming a thick Ni layer on front and back surfaces of the metallic base material 11 and etching only the Ni layer on the front surface for mounting of the semiconductor chip. This method makes it possible to roughen a surface of the thin section 12a that is to be attached to the encapsulation resin. This rough surface enhances its anchor effect, i.e., the encapsulation resin firmly adheres to the lead frame. Accordingly, it alleviates the aforementioned problem of the detachment of lead sections from the encapsulation resin during the fabrication of the package. Note that the Ni layer to be exposed from the back surface of the package, which is formed on the back surface of the lead frame, is formed in the conventional manner. Therefore, the thickness and surface smoothness of the Ni layer on the back surface remains the same as the conventional packages with single-sided encapsulation. Accordingly, there is no resin leakage during the molding process for encapsulation. In addition, there is no deterioration of solder wettability that affects the connection between the semiconductor package and the external board.

Figure 4:
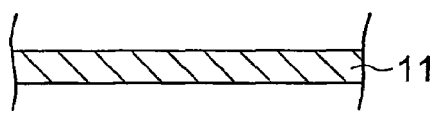
FIGS. 4A-4H show schematic flow diagrams illustrating the series of steps for manufacturing the lead frame of the first embodiment of the present invention.
Figure 4:
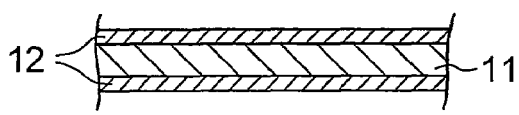
Figure 4:
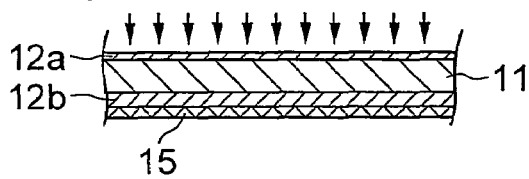
Figure 4:
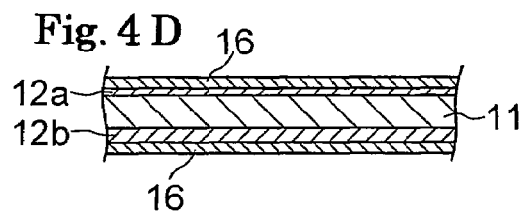
Figure 4:
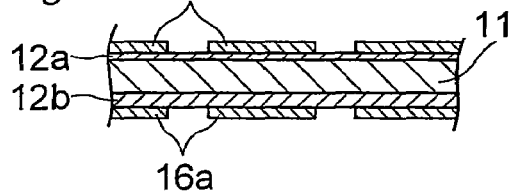
Figure 4:
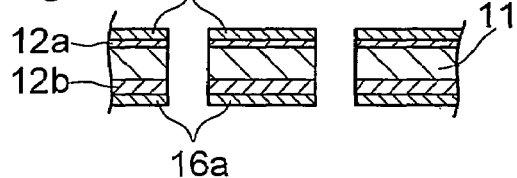
Figure 4:
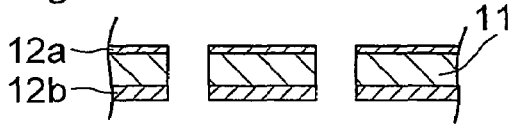
Figure 4:
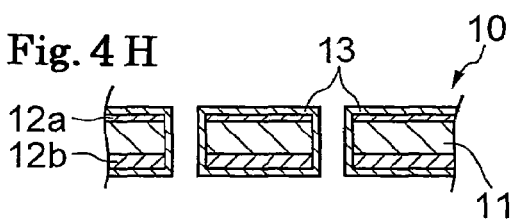

A method of manufacturing the lead frame according to the first embodiment of the present invention is hereinafter described in reference to FIGS. 4A-4H. First, as shown in FIG. 4A, the metallic base material 11 is prepared in the shape of a plate. Next, as shown in FIG. 4B, Ni layer 12 having a thickness ranging from approximately 2.5 to 5 μm is formed on both sides of the metallic base material 11. Then, as shown in FIG. 4C, one side of the metallic base material 11 is sprayed with an etching solution to reduce the thickness of the Ni layer 12 on this side by approximately 0.5-2 μm. In this manner, the thin section 12a is formed in a region that has been etched, whereas the thick section 12b is formed where there has been no etching.

Since the metallic base material 11 shown in FIG. 4C is not yet patterned to have a lead frame pattern, the etching solution sprayed on one side of the metallic base material 11 has minimal effect on the Ni layer formed on the other side where the etching solution has not been sprayed. However, it is possible that some of the etching solution spreads to the other side via the lateral surface of the metallic base material 11 and adheres to the Ni layer on the other side. Accordingly, as a precaution, the Ni layer on the other side may be protected by, for example, a protective film. FIG. 4C shows such protective film 15, which fully covers the other side of the metallic base material 11.

After the etching process, the protective film 15 is removed. Next, as shown in FIG. 4D, dry film resists 16 are laminated on both the thin section 12a and thick section 12b of the Ni layer. Lithographic exposure is performed using a predetermined mask and then development is performed. Consequently, as shown in FIG. 4E, resist patterns 16a are formed on both sides of the metallic base material 11. Next, as shown in FIG. 4F, etching is performed to dissolve and remove the exposed regions of the thin section 12a and the thick section 12b of the Ni layer, which are exposed from the resist patterns 16a. Parts of the metallic base material 11 located below these exposed regions are also dissolved and removed by this etching process. Since the etching speed of the metallic base material 11 is much faster than that of the Ni layer, some parts of the Ni layer create burr-like or flash-like remainders. To remove these remainders, it is preferable to perform Ni-selective etching. Thereafter, as shown in FIG. 4G, resist patterns 16a are removed. Finally, as shown in FIG. 4H, a layered structure 13 including a Pd layer and an Au layer is formed over the entire surface of the metallic base material 11. In this manner, the lead frame 10 having improved adhesion to the resin is fabricated.

Note that, after removal of the resist patterns 16a and before the formation of the layered structure 13 including the Pd layer and Au layer over the entire surface of the metallic base material 11, the extremely thin Ni layer 14 not more than approximately 0.2 μm thick may be formed over the entire surface of the metallic base material 11 as described above in reference to FIG. 3. The extremely thin Ni layer 14 can be formed on the lateral surface of the lead frame 10 where the metallic base material 11 is exposed. This extremely thin Ni layer 14 has negligible effect on the adhesion of the thin section 12a of the Ni layer formed by the etching.

It is preferable that thickness of the Ni layer 12 formed on both sides of the metallic base material before etching should not be less than 2.5 μm so as not to cause bending due to the difference in stress between the Ni layer on one side and that on the other side. This bending problem may occur after the Ni layer 12 on one side has been etched to reduce the thickness by 0.5-2 μm. On the other hand, the thickness of the Ni layer 12 formed on both sides of the metallic base material before etching should not be more than 5 μm. This is because considerable time may be required for the plating step, which is undesirable in commercial production.

An etching step to reduce the thickness of the Ni layer can take several seconds for each 0.4-0.6 μm reduction, which means that the etching step for approximately 20 seconds can reduce the thickness of the Ni layer by 2 μm or more. Therefore, the time required to reduce the thickness of the Ni layer by 0.5-2 μm is only a few tens of seconds, which does not substantially affect productivity.

Figure 5:
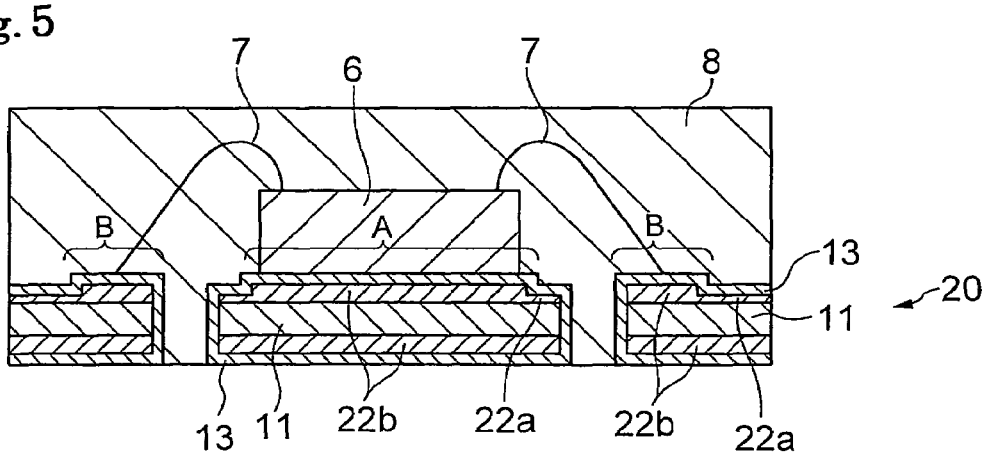
FIG. 5 shows a cross-sectional view of a semiconductor device which is manufactured by the use of a lead frame according to the second embodiment of the present invention.

Next, a lead frame according to the second embodiment of the present invention is described in reference to FIG. 5. The lead frame 20 of the second embodiment is similar to that of the first embodiment except that the Ni layer formed on the front surface has both thick and thin sections. Specifically, the lead frame 20 of the second embodiment is characterized in that the Ni layer formed on a side for mounting of a semiconductor device 6 has a thick section 22b in areas A and B and a thin section 22a in an area other than the areas A and B. Note that the area A refers to a die-pad site where the semiconductor device 6 is placed, whereas the area B refers to a wire-bonding site where a wire bonding adheres. The thick section 22b of the Ni layer is also formed on a back surface which is the side for connection with an external board (not shown).

This configuration makes it possible to provide the Ni layer, which is on the front side for mounting of the semiconductor device 6, with a smooth surface in the regions for mounting of the semiconductor device 6 and for connection with the bonding wire 7. Accordingly, the Ni layer of the lead frame 20 not only provides a better electrical connection to the semiconductor device 6 and the bonding wire 7, but also improves adhesion between the resin 8 and the lead frame 20.

Figure 6:
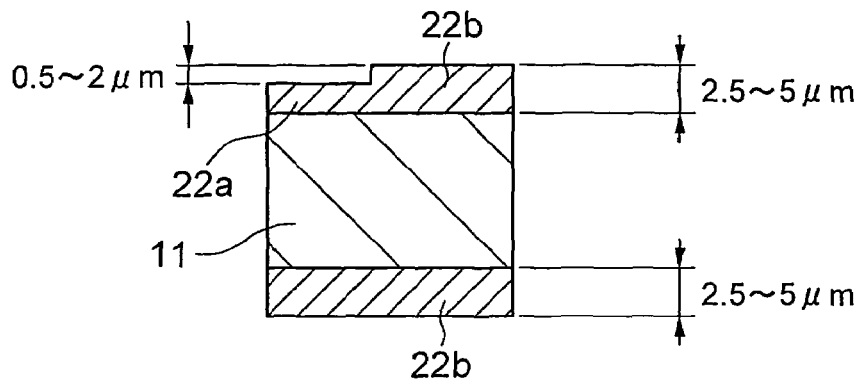
FIG. 6 shows a partially enlarged sectional view of one example of a lead section of a lead frame according to the second embodiment of the present invention.

The lead frame 20 of the second embodiment may be formed as follows. First, in a manner similar to the first embodiment, an Ni layer having a thickness ranging from approximately 2.5 to 5 μm thick is formed on both sides of the metallic base material 11. Next, before spraying an etching solution over one side of the metallic base material 11, a mask having a predetermined pattern is applied over the Ni layer on the side to be sprayed. This mask may be formed from a dry film resist. Thereafter, the etching solution is sprayed to etch the portion of the Ni layer exposed from the mask and to reduce the thickness thereof by approximately 0.5-2 µm. The mask is then removed to obtain the configuration shown in a partially enlarged sectional view of FIG. 6. The structure shown in FIG. 6 has a thick section 22b that has a thickness ranging from approximately 2.5 to 5 µm and a thin section 22a that is approximately 0.5-2 µm thinner than the thick section 22b.

After removing the mask, the steps shown in FIGS. 4D-4H are performed in a manner similar to the first embodiment, which provides a lead frame 20 of the second embodiment. The lead frame 20 has such features that the Ni layer on the side for mounting of the semiconductor device has a thick section and a thin section. The thick section is formed in a die-pad site and a wire-bonding site, whereas the thin section is formed in an area other than the die-pad site and the wire-bonding site. Note that the Ni layer on the side for the connection with the external board has a thick section which is similar to the lead frame 10 of the first embodiment.

Figure 7:
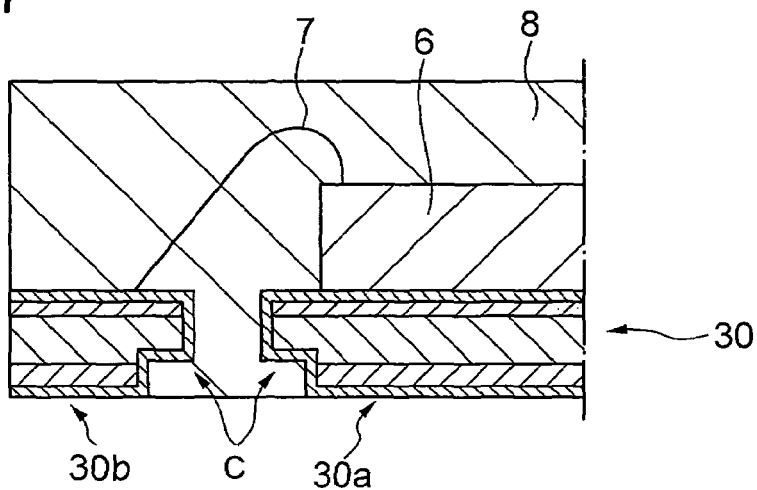
FIG. 7 shows a cross-sectional view of a left half of a semiconductor device which is manufactured by the use of a lead frame according to the third embodiment of the present invention.
Figure 8:
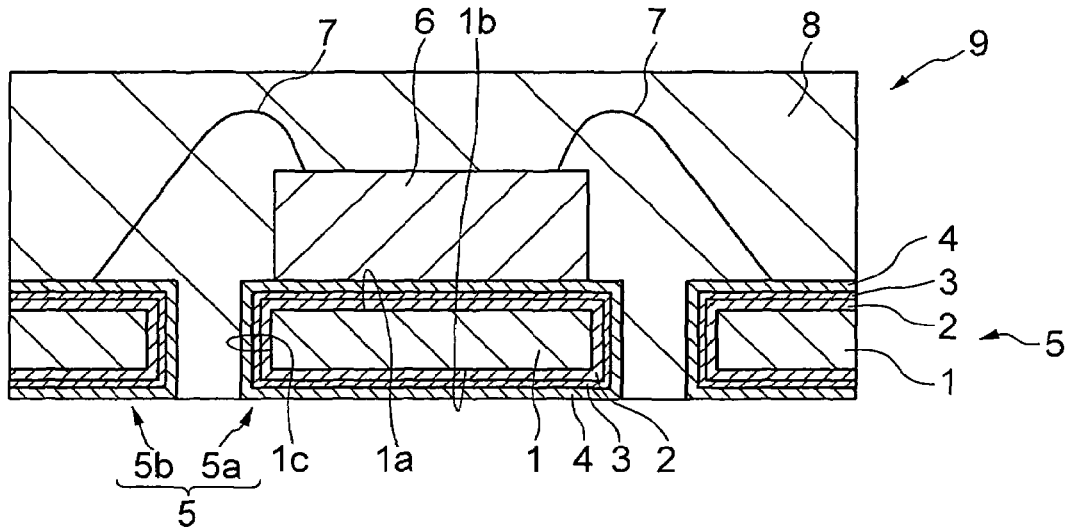
FIG. 8 shows a cross-sectional view of a semiconductor device which is manufactured by the use of a conventional lead frame.

Next, a lead frame according to the third embodiment of the present invention is described. As shown in FIG. 7, the lead frame 30 of the third embodiment is characterized by having an overhanging section C that has a reversed staircase shape formed on an edge of a die pad section 30a and a lead section 30b in addition to having an Ni layer with a thick section on all or a part of a side for mounting of the semiconductor chip, and a thin section on the other side for connection with the external board. Note that FIG. 7 shows one example of the lead frame 30 in which the thin section is formed on entire surface of the side for mounting of the semiconductor device 6.

With this configuration, the resin 8 can spread to the back surface of the lead frame 30 via the overhanging section C during resin molding step to encapsulate the semiconductor chip 6 mounted on the front surface. Accordingly, the die pad section 30a and/or the lead section 30b can be much more firmly supported by the resin 8. Note that although the overhanging section C is formed on both the die pad section 30a and the lead section 30b in FIG. 7, the overhanging section C may be formed on either the die pad section 30a or the lead section 30b.

The lead frame 30 of the third embodiment may be formed as follows. Before performing the step shown in FIG. 4D, the steps similar to those described in the first and second embodiments are performed to form an Ni layer having a thick section and a thin section. Next, as shown in FIG. 4D, dry film resists 16 are lithographically exposed and developed in similar manner as the first and second embodiments except that two types of glass masks having different patterns are respectively used for the front and back surfaces to create two different mask patterns on the front and back surfaces.

These two different mask patterns make it possible to half-etch the metallic base material 11 only from the back surface. Namely, regions on the Ni layer exposed from the masks and a part of the metallic base material 11 located below such exposed regions are etched to create the overhanging section C having a reversed staircase shape. After removing the masks, the step shown in FIG. 4H is performed. In this manner, lead frame 30 shown in FIG. 7 is fabricated.

EXAMPLES

First Example

A metallic base material of copper sheet 0.2 mm thick and 180 mm wide was pretreated for plating. Thereafter, an Ni layer having a thickness ranging from 3.3 to 4.1 µm was formed on front and back surfaces of the metallic base material using a sulphamic acid Ni plating bath.

Next, one side (front surface side) of the metallic base material having the Ni layer was sprayed with an etching solution (ferric chloride solution) for approximately 10 seconds to reduce the thickness of the Ni layer on this side by 0.8-1.0 µm. In this manner, a thin section having a thickness ranging from 2.3 to 3.2 µm was formed.

Although no protective film using a resist was provided on the reverse side (back side) of the metallic base material, no substantial problem was observed. In other words, an absence of protective film caused no substantial problem with regard to the spreading and adhesion of the etching solution to the Ni layer on the reverse side of the metallic base material, provided that the spray etching duration did not exceed approximately 20 seconds.

Next, dry film resists were laminated over the Ni layer formed on the front and back surfaces of the metallic base material. Glass masks each having a lead frame pattern were placed for lithographic exposure on the dry film resists. After lithographic exposure, the glass masks were removed and developed. In this manner, resist patterns were formed on both sides of the metallic base material having the Ni layer.

Next, the metallic base material was etched to dissolve and remove a part of the Ni layer exposed from the resist patterns together with a part of the metallic base material located below the exposed part to form a lead frame pattern. The resist patterns were then removed. Note that the Ni layer was formed on the front and back surfaces of the metallic base material having the lead frame pattern, but the Ni layer was not formed on the lateral surface of the metallic base material.

A Pd layer of 0.10 µm thick was formed on all the surfaces (the upper and lower surfaces and the lateral surface) of the metallic base material having the lead frame pattern. In addition, an Au layer of 0.05 µm thick was formed on the Pd layer. In this manner, the lead frame of sample 1 was formed.

Samples 2-4 were also formed in a manner similar to sample 1, except that the spraying times were changed. The characteristic feature of sample 2 was that the Ni layer on one side was thinner than that on the other side by 0.4-0.6 µm. The characteristic feature of sample 3 was that the Ni layer on one side was thinner than that on the other side by 1.3-1.6 µm. The characteristic feature of sample 4 was that the Ni layer on one side was thinner than that on the other side by 1.8-2.2 µm.

Samples 1-4 were evaluated in terms of the adhesive strength between the resin and the thin section of the Ni layer having the Pd layer and the Au layer in a manner similar to that described above. The adhesive strengths of samples 1-4 were 23.4 MPa, 18.7 MPa, 23.2 MPa, and 21.3 MPa, respectively.

From these results, it was confirmed that all samples 1-4 had sufficient adhesion to the resin. It was also confirmed that an etching process to reduce the Ni layer by 0.8-1.6 µm was particularly advantageous from the viewpoint of adhesive strength in comparison to the technique shown in Japanese Patent Application Laid-Open No. 2006-93559 using the rough Ni layer, which achieved the adhesive strength of 19.9 MPa mentioned above, and from the viewpoint of etching duration which affects productivity.

Second Example

In a manner similar to that in the first example, an Ni layer having a thickness ranging from 3.0 to 3.5 µm was formed on the front and back surfaces of the metallic base material using a sulphamic acid Ni plating bath. Next, a mask was formed on the side for mounting of a semiconductor device using a resist to protect a region for placing the semiconductor device and a region for providing wire bonding. A region of the Ni layer exposed from the mask was sprayed with an etching solution for approximately 10 seconds to reduce the thickness of the exposed region by approximately 1.0 µm. The mask was then removed.

Thereafter, the steps similar to those in the first example were performed to complete fabrication of a lead frame. The characteristic of this lead frame was that the Ni layer had a thick section in the region for placing a semiconductor device (die-pad site) and the region for providing a wire bonding (wire-bonding site), and that the Ni layer had a thin section in a region other than the thick section. The Ni layer also had a thick section on the reverse side for connection with an external board. A semiconductor device was placed on the die-pad site of the die pad section of the lead frame, and the semiconductor device was connected to the wire-bonding site on each of the lead sections of the lead frame via a bonding wire. Thereafter, the upper surface for mounting of the semiconductor device and the lateral surface of the lead frame were encapsulated or enclosed with resin. After the cutting step, multiple semiconductor packages were obtained.

The lead frame obtained in this manner was provided with the Ni layer having similar thickness and smoothness to the conventional Ni layer not only at the back surface of the lead frame but also in the region for placing the semiconductor device and the region for providing the wire bonding. Accordingly, there was no substantial problem in placing the semiconductor device or in providing the wire bonding. In addition, the thin section of the Ni layer that had been etched had better contact with the resin, which improved adhesion to the resin as compared with the conventional lead frame having the conventional Ni layer.

Although the present invention has been described in detail, those skilled in the art should understand that they may make various changes, substitutions and alterations without departing from the scope of the invention in its broadest form. Thus, it is intended that the present invention covers the modifications and variations of this invention provided they come within the scope of the appended claims and their equivalents. This application is based on Japanese patent application No. 2008-250738, which is herein incorporated by reference.

What is claimed is:

1. A lead frame comprising:
   a base material having a front surface for mounting of a semiconductor chip and a back surface for connection with an external board; and
   an Ni layer having a thick section and a thin section, the thick section being formed on the back surface of the base material and the thin section being formed on all or a part of the front surface of the base material,
   wherein said thick section has a thickness ranging from 2.5 to 5 µm, and said thin section is 0.5-2 µm thinner than said thick section.

2. The lead frame according to claim 1, wherein said thick section is further formed on a die-pad site and a wire-bonding site of said front surface, and said thin section is formed on other area than said die-pad site and wire-bonding site of said front surface.

3. The lead frame according to claim 2, wherein a Pd-plated layer and an Au-plated layer are formed over said thick section and said thin section.

4. The lead frame according to claim 2, wherein the lead frame includes a die pad section and a lead section, and an overhanging section having a reversed staircase shape is formed on an edge of said die pad section and/or lead section.

5. The lead frame according to claim 1, wherein a Pd-plated layer and an Au-plated layer are formed over said thick section and said thin section.

6. The lead frame according to claim 1, wherein the lead frame includes a die pad section and a lead section, and an overhanging section having a reversed staircase shape is formed on an edge of said die pad section and/or lead section.

7. The lead frame according to claim 1, wherein either no Ni layer or an extremely thin Ni layer not more than 0.2 µm thick is formed on a lateral surface of the base material of the lead frame.

8. The lead frame according to claim 7, wherein a Pd-plated layer and an Au-plated layer are formed on a lateral surface of the base material of the lead frame either directly or via said extremely thin Ni layer.

9. A lead frame comprising:
   a base material having a front surface for mounting of a semiconductor chip and a back surface for connection with an external board; and
   an Ni layer having a thick section and a thin section, the thick section being formed on the back surface of the base material and the thin section being formed on all or a part of the front surface of the base material,
   wherein said thick section is further formed on a die-pad site and a wire-bonding site of said front surface, and said thin section is formed on other area than said die-pad site and wire-bonding site of said front surface.

10. The lead frame according to claim 9, wherein a Pd-plated layer and an Au-plated layer are formed over said thick section and said thin section.

11. The lead frame according to claim 9, wherein a Pd-plated layer and an Au-plated layer are formed over said thick section and said thin section.

12. The lead frame according to claim 9, wherein the lead frame includes a die pad section and a lead section, and an overhanging section having a reversed staircase shape is formed on an edge of said die pad section and/or lead section.

13. The lead frame according to claim 9, wherein either no Ni layer or an extremely thin Ni layer not more than 0.2 µm thick is formed on a lateral surface of the base material of the lead frame.

14. The lead frame according to claim 13, wherein a Pd-plated layer and an Au-plated layer are formed on a lateral surface of the base material of the lead frame either directly or via said extremely thin Ni layer.

15. A lead frame comprising:
   a base material having a front surface for mounting of a semiconductor chip and a back surface for connection with an external board; and
   an Ni layer having a thick section and a thin section, the thick section being formed on the back surface of the base material and the thin section being formed on all or a part of the front surface of the base material,
   wherein the lead frame includes a die pad section and a lead section, and an overhanging section having a reversed staircase shape is formed on an edge of said die pad section and/or lead section.

16. A method of manufacturing a lead frame comprising the steps of:
   forming an Ni layer on both front and back surfaces of a metallic base material to have a specified thickness; and
   etching only the Ni layer formed on the front surface which corresponds to a side for mounting of a semiconductor device so that the Ni layer formed on the front surface is thinner than the Ni layer formed on the back surface which corresponds to a side for connection with an external board.

17. A method of manufacturing a lead frame comprising the steps of:
forming an Ni layer having a thickness ranging from 2.5 to 5 μm on both front and back surfaces of a metallic base material; and
etching only the Ni layer on the front surface which corresponds to a side for mounting of a semiconductor device such that the Ni layer formed on the front surface is 0.5-2 μm thinner than the Ni layer formed on the back surface which corresponds to a side for connection with an external board.

18. The method of manufacturing a lead frame according to claim 17 further comprising:
forming a predetermined mask over the Ni layer;
etching part of the Ni layer exposed from the mask and part of the metallic base material positioned below the part of the Ni layer;
removing the mask; and
forming a Pd-plated layer and an Au-plated layer.

19. The method for manufacturing a lead frame according to claim 18, wherein an extremely thin Ni layer not more than 0.2 μm thick is formed before the step of forming the Pd-plated layer and the Au-plated layer.

* * * * *